United States Patent
Chadha et al.

(10) Patent No.: US 12,027,198 B2
(45) Date of Patent: Jul. 2, 2024

(54) MITIGATING DUTY CYCLE DISTORTION DEGRADATION DUE TO DEVICE AGING ON HIGH-BANDWIDTH MEMORY INTERFACE

(71) Applicant: NVIDIA CORPORATION, Santa Clara, CA (US)

(72) Inventors: Ish Chadha, San Jose, CA (US); Virendra Kumar, Mountain View, CA (US); Vipul Katyal, San Jose, CA (US); Abhijith Kashyap, San Francisco, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 187 days.

(21) Appl. No.: 17/866,327

(22) Filed: Jul. 15, 2022

(65) Prior Publication Data
US 2023/0162780 A1  May 25, 2023

Related U.S. Application Data

(60) Provisional application No. 63/281,938, filed on Nov. 22, 2021.

(51) Int. Cl.
*G11C 7/00* (2006.01)
*G06F 1/10* (2006.01)
(Continued)

(52) U.S. Cl.
CPC ............ *G11C 11/4076* (2013.01); *G06F 1/10* (2013.01); *G11C 11/406* (2013.01)

(58) Field of Classification Search
CPC . G11C 11/4076; G11C 11/406; G11C 7/1066; G11C 7/1057; G11C 7/1084; G11C 7/1093; G11C 11/4093; G11C 11/40611; G11C 11/401; G06F 1/10; G06F 13/1689; G06T 1/60; G06T 1/20
(Continued)

(56) References Cited

U.S. PATENT DOCUMENTS

| 6,636,449 B2 * | 10/2003 | Matsuzaki | G11C 11/4072 365/233.14 |
| 7,082,072 B2 * | 7/2006 | Dono | G11C 11/40618 365/230.03 |

(Continued)

*Primary Examiner* — Tha-O H Bui
(74) *Attorney, Agent, or Firm* — Squire Patton Boggs LLP; Sarah Mirza (57) ABSTRACT

Embodiments include a memory device with an improved circuit to mitigate degradation of memory devices due to aging. Memory device input/output pins include delay elements for adjusting the delay in each memory input/output signal path to synchronize the input/output signal paths with one another. Certain data patterns, including a long series of logic zero values or a long series of logic one values, can cause asymmetric degradation of transistors included in the delay elements. This asymmetric degradation can reduce the operating frequency of the memory device, leading to lower performance. The disclosed embodiments change the polarity of signals passing through the delay elements to mitigate the effects of asymmetric degradation resulting from these data patterns. As a result, the performance of memory devices is improved relative to prior approaches.

20 Claims, 6 Drawing Sheets

(51) Int. Cl.
*G11C 11/406* (2006.01)
*G11C 11/4076* (2006.01)

(58) Field of Classification Search
USPC .......................................................... 365/194
See application file for complete search history.

(56) References Cited

U.S. PATENT DOCUMENTS

| | | | | |
|---|---|---|---|---|
| 7,164,615 B2* | 1/2007 | Park | .................. | G11C 11/40611 |
| | | | | 365/189.16 |
| 7,313,046 B2* | 12/2007 | Choi | ..................... | G11C 11/406 |
| | | | | 365/230.03 |
| 8,953,409 B2* | 2/2015 | Ishikawa | ............. | G11C 11/4076 |
| | | | | 365/194 |

* cited by examiner

MITIGATING DUTY CYCLE DISTORTION DEGRADATION DUE TO DEVICE AGING ON HIGH-BANDWIDTH MEMORY INTERFACE

CROSS-REFERENCE TO RELATED APPLICATIONS

This application claims priority benefit of the U.S. Provisional Patent Application titled, "MITIGATING DUTY CYCLE DISTORTION DEGRADATION DUE TO DEVICE AGING ON HIGH-BANDWIDTH MEMORY INTERFACE," filed on Nov. 22, 2021 and having Ser. No. 63/281,938. The subject matter of this related application is hereby incorporated herein by reference.

BACKGROUND

Field of the Various Embodiments

Various embodiments relate generally to computer memory systems and, more specifically, to mitigating duty cycle distortion degradation due to aging on high-bandwidth memory interface.

Description of the Related Art

A computer system generally includes, among other things, one or more processing units, such as central processing units (CPUs) and/or graphics processing units (GPUs), and one or more memory systems. One type of memory system is referred to as system memory, which is accessible by both the CPU(s) and the GPU(s). Another type of memory system is graphics memory, which is typically accessible only by the GPU(s). These memory systems comprise multiple memory devices. Memory systems for high-performance computer systems often include high-bandwidth memory (HBM) systems for at least a portion of the memory accessible by one or more processors, such as the CPU(s), the GPU(s), and/or the like. The memory devices employed in HBM systems are referred to herein as HBM dynamic random-access memory (DRAM) devices. Successive generations of HBM memory systems generally increase in speed and performance. As one example, the HBM3 interface operates at approximately two times the frequency of earlier generation HBM systems. Correspondingly, at higher operating frequencies, timing margins and tolerances become smaller and more difficult to meet.

One technique for meeting these more difficult timing margins is to adjust the timing of each of the data input/output (I/O) pins with each other and/or with a reference clock signal. With HBM systems, each HBM DRAM device has a large number of data I/O pins, such as 1024 data I/O pins, and each data I/O pin and/or clock signal pin has a separate, independently controllable delay element. These delay elements are calibrated to adjust for process, voltage, and temperature (PVT) variations. The delay elements are adjusted so that each data I/O pin can meet the timing margins with respect to the each other and/or to the reference clock signal.

One problem with this approach for meeting timing margins in an HBM memory system is that certain data patterns present in the HBM interface and transmitted to the data I/O pins can result in reduced operating frequency of the memory device. This reduced operating frequency of the memory device can lead to lower performance of the HBM memory system. The reduction in operating frequency is caused by asymmetric aging of certain transistors in the memory device. In general, each delay element of the memory device includes a relatively large number of negative-channel metal oxide semiconductor (NMOS) transistors and positive-channel metal oxide semiconductor (PMOS) transistors. High activity on NMOS transistors can cause degradation due to hot carrier injection (HCI). Low activity on PMOS transistors can cause degradation due to negative bias temperature instability (NBTI). Due to these phenomena, different data activity, such as a long series of zero values or a long series of one values, can cause asymmetric aging of NMOS transistors and/or PMOS transistors.

If the PMOS transistors age more relative to the NMOS transistors, then transitions from a zero value to a one value take more time than transitions from a one value to a zero value. Conversely, if the NMOS transistors age more relative to the PMOS transistors, then transitions from a one value to a zero value take more time than transitions from a zero value to a one value. This difference in transition times is referred to herein as duty cycle degradation (DCD). When duty cycle degradation occurs, the HBM interface is timed to accommodate the worst-case transition time in order to ensure that the HBM interface is reliable. However, timing the HBM interface to accommodate the worst-case transition time results in lower operating frequency and, correspondingly, lower performance.

As the foregoing illustrates, what is needed in the art are more effective techniques for compensating for duty cycle distortion in memory devices.

SUMMARY

Various embodiments of the present disclosure set forth a computer-implemented method for generating control signals for a memory device. The method includes detecting a first refresh command directed to the memory device. The method further includes, in response to detecting the first refresh command, selecting a first polarity for a delay element of the memory device. The method further includes detecting a second refresh command directed to the memory device. The method further includes, in response to detecting the second refresh command, selecting a second polarity for the delay element of the memory device.

Other embodiments include, without limitation, a system that implements one or more aspects of the disclosed techniques, and one or more computer readable media including instructions for performing one or more aspects of the disclosed techniques, as well as a method for performing one or more aspects of the disclosed techniques.

At least one technical advantage of the disclosed techniques relative to the prior art is that, with the disclosed techniques, transistors included in delay lines of a memory device are not exposed to long sequences of zero values or one values over prolonged periods of time. As a result, the effects of asymmetric aging of NMOS transistors and PMOS transistors included in delay lines of a memory device are reduced relative to prior approaches. By reducing the effects of asymmetric aging, the disclosed techniques enable all memory devices to reliably operate at a higher frequency relative to prior techniques, leading to increased memory performance. These advantages represent one or more technological improvements over prior art approaches.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

DETAILED DESCRIPTION

In the following description, numerous specific details are set forth to provide a more thorough understanding of the various embodiments. However, it will be apparent to one skilled in the art that the inventive concepts may be practiced without one or more of these specific details.

System Overview

Figure 1:
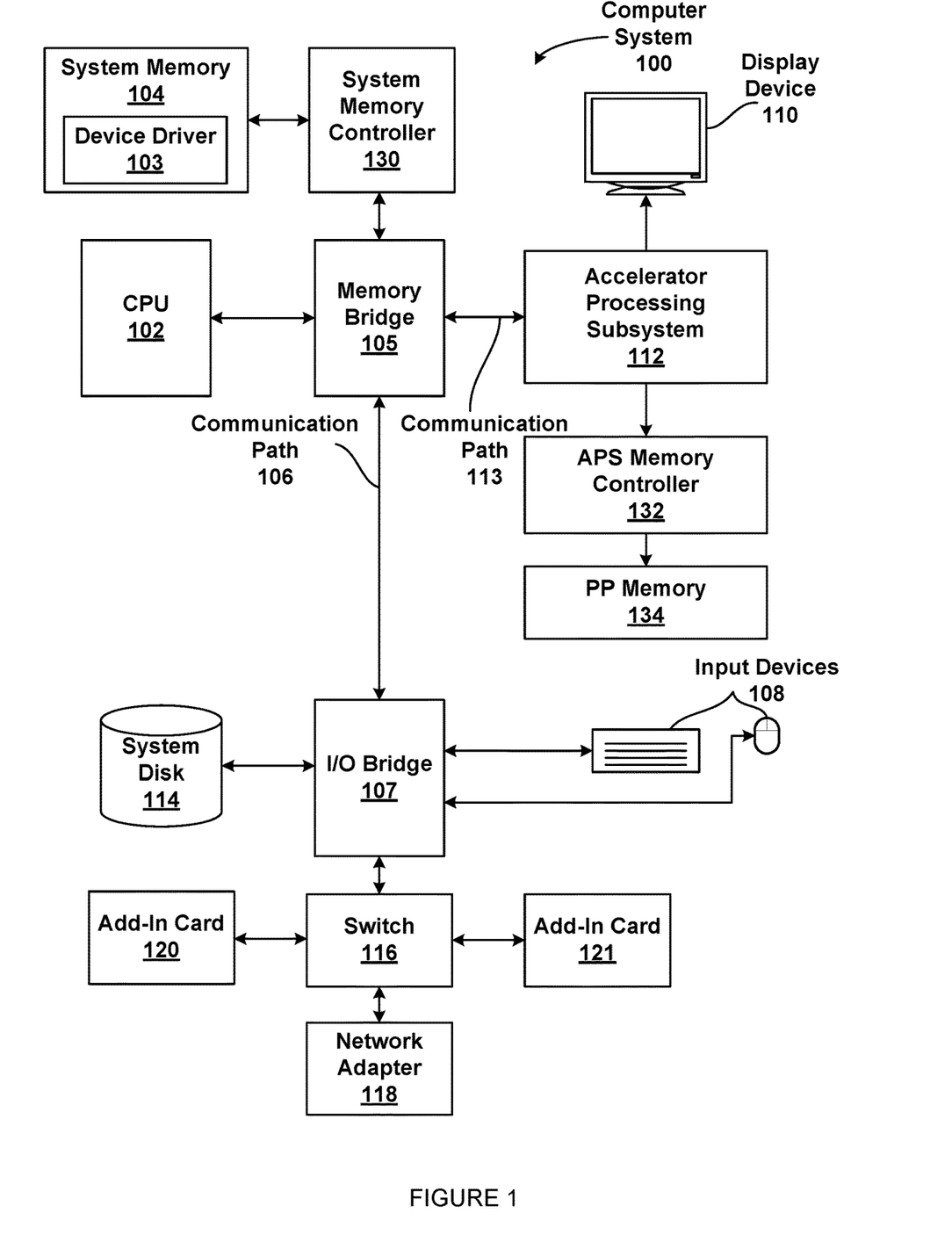
FIG. 1 is a block diagram of a computer system configured to implement one or more aspects of the various embodiments.

FIG. 1 is a block diagram of a computer system 100 configured to implement one or more aspects of the various embodiments. As shown, computer system 100 includes, without limitation, a central processing unit (CPU) 102 and a system memory 104 coupled to an accelerator processing subsystem 112 via a memory bridge 105 and a communication path 113. Memory bridge 105 is coupled to system memory 104 via a system memory controller 130. Memory bridge 105 is further coupled to an I/O (input/output) bridge 107 via a communication path 106, and I/O bridge 107 is, in turn, coupled to a switch 116. Accelerator processing subsystem 112 is coupled to parallel processing memory 134 via an accelerator processing subsystem (APS) memory controller 132.

In operation, I/O bridge 107 is configured to receive user input information from input devices 108, such as a keyboard or a mouse, and forward the input information to CPU 102 for processing via communication path 106 and memory bridge 105. Switch 116 is configured to provide connections between I/O bridge 107 and other components of the computer system 100, such as a network adapter 118 and various add-in cards 120 and 121.

As also shown, I/O bridge 107 is coupled to a system disk 114 that may be configured to store content and applications and data for use by CPU 102 and accelerator processing subsystem 112. As a general matter, system disk 114 provides non-volatile storage for applications and data and may include fixed or removable hard disk drives, flash memory devices, and CD-ROM (compact disc read-only-memory), DVD-ROM (digital versatile disc-ROM), Blu-ray, HD-DVD (high-definition DVD), or other magnetic, optical, or solid-state storage devices. Finally, although not explicitly shown, other components, such as universal serial bus or other port connections, compact disc drives, digital versatile disc drives, film recording devices, and the like, may be connected to I/O bridge 107 as well.

In various embodiments, memory bridge 105 may be a Northbridge chip, and I/O bridge 107 may be a Southbridge chip. In addition, communication paths 106 and 113, as well as other communication paths within computer system 100, may be implemented using any technically suitable protocols, including, without limitation, Peripheral Component Interconnect Express (PCIe), AGP (Accelerated Graphics Port), HyperTransport, or any other bus or point-to-point communication protocol known in the art.

In some embodiments, accelerator processing subsystem 112 comprises a graphics subsystem that delivers pixels to a display device 110 that may be any conventional cathode ray tube, liquid crystal display, light-emitting diode display, and/or the like. In such embodiments, accelerator processing subsystem 112 incorporates circuitry optimized for graphics and video processing, including, for example, video output circuitry. Such circuitry may be incorporated across one or more accelerators included within accelerator processing subsystem 112. An accelerator includes any one or more processing units that can execute instructions such as a central processing unit (CPU), a parallel processing unit (PPU) included in accelerator processing subsystem, 112, a graphics processing unit (GPU), an intelligence processing unit (IPU), neural processing unit (NAU), tensor processing unit (TPU), neural network processor (NNP), a data processing unit (DPU), a vision processing unit (VPU), an application specific integrated circuit (ASIC), a field-programmable gate array (FPGA), and/or the like.

In some embodiments, accelerator processing subsystem 112 incorporates circuitry optimized for general purpose and/or compute processing. Again, such circuitry may be incorporated across one or more accelerators included within accelerator processing subsystem 112 that are configured to perform such general purpose and/or compute operations. In yet other embodiments, the one or more accelerators included within accelerator processing subsystem 112 may be configured to perform graphics processing, general purpose processing, and compute processing operations. System memory 104 includes at least one device driver 103 configured to manage the processing operations of the one or more accelerators within accelerator processing subsystem 112.

In various embodiments, accelerator processing subsystem 112 may be integrated with one or more other elements of FIG. 1 to form a single system. For example, accelerator processing subsystem 112 may be integrated with CPU 102 and other connection circuitry on a single chip to form a system on chip (SoC).

In operation, CPU 102 is the master processor of computer system 100, controlling and coordinating operations of other system components. In particular, CPU 102 issues commands that control the operation of accelerators within accelerator processing subsystem 112. In some embodiments, CPU 102 writes a stream of commands for accelerators within accelerator processing subsystem 112 to a data structure (not explicitly shown in FIG. 1) that may be located in system memory 104, PP memory 134, or another storage location accessible to both CPU 102 and accelerators. A pointer to the data structure is written to a pushbuffer to initiate processing of the stream of commands in the data structure. The accelerator reads command streams from the pushbuffer and then executes commands asynchronously relative to the operation of CPU 102. In embodiments where multiple pushbuffers are generated, execution priorities may be specified for each pushbuffer by an application program via device driver 103 to control scheduling of the different pushbuffers.

Each accelerator includes an I/O (input/output) unit that communicates with the rest of computer system 100 via the communication path 113 and memory bridge 105. This I/O unit generates packets (or other signals) for transmission on communication path 113 and also receives all incoming packets (or other signals) from communication path 113, directing the incoming packets to appropriate components of the accelerator. The connection of accelerators to the rest of computer system 100 may be varied. In some embodiments, accelerator processing subsystem 112, which includes at least one accelerator, is implemented as an add-in card that can be inserted into an expansion slot of computer system 100. In other embodiments, the accelerators can be integrated on a single chip with a bus bridge, such as memory bridge 105 or I/O bridge 107. Again, in still other embodiments, some or all of the elements of the accelerators may be included along with CPU 102 in a single integrated circuit or system of chip (SoC).

CPU 102 and accelerators within accelerator processing subsystem 112 access system memory via a system memory controller 130. System memory controller 130 transmits signals to the memory devices included in system memory 104 to initiate the memory devices, transmit commands to the memory devices, write data to the memory devices, read data from the memory devices, and/or the like. One example memory device employed in system memory 104 is double-data rate SDRAM (DDR SDRAM or, more succinctly, DDR). DDR memory devices perform memory write and read operations at twice the data rate of previous generation single data rate (SDR) memory devices. In some examples, HBM DDR memory devices can be employed in system memory and/or other memory systems accessible by CPU 102.

In addition, accelerators and/or other components within accelerator processing subsystem 112 access PP memory 134 via an accelerator processing subsystem (APS) memory controller 132. APS memory controller 132 transmits signals to the memory devices included in PP memory 134 to initiate the memory devices, transmit commands to the memory devices, write data to the memory devices, read data from the memory devices, and/or the like. One example memory device employed in PP memory 134 is HBM DRAM. Compared with DDR memory devices, HBM DRAM memory devices are configured with a higher speed I/O interface and a wider data bus, in order to transfer more data bits with each memory write and read operation. By employing a high speed interface and a wider data bus, HBM DRAM memory devices are able to achieve the high data transfer rates typically needed by accelerators.

It will be appreciated that the system shown herein is illustrative and that variations and modifications are possible. The connection topology, including the number and arrangement of bridges, the number of CPUs 102, and the number of accelerator processing subsystems 112, may be modified as desired. For example, in some embodiments, system memory 104 could be connected to CPU 102 directly rather than through memory bridge 105, and other devices would communicate with system memory 104 via memory bridge 105 and CPU 102. In other alternative topologies, accelerator processing subsystem 112 may be connected to I/O bridge 107 or directly to CPU 102, rather than to memory bridge 105. In still other embodiments, I/O bridge 107 and memory bridge 105 may be integrated into a single chip instead of existing as one or more discrete devices.

Lastly, in certain embodiments, one or more components shown in FIG. 1 may not be present. For example, switch 116 could be eliminated, and network adapter 118 and add-in cards 120, 121 would connect directly to I/O bridge 107.

It will be appreciated that the core architecture described herein is illustrative and that variations and modifications are possible. Among other things, the computer system 100 of FIG. 1, may include any number of CPUs 102, accelerator processing subsystems 112, or memory systems, such as system memory 104 and parallel processing memory 134, within the scope of the disclosed embodiments. Further, as used herein, references to shared memory may include any one or more technically feasible memories, including, without limitation, a local memory shared by one or more accelerators within accelerator processing subsystem 112, memory shared between multiple accelerator processing subsystems 112, a cache memory, parallel processing memory 134, and/or system memory 104. Please also note, as used herein, references to cache memory may include any one or more technically feasible memories, including, without limitation, an L1 cache, an L1.5 cache, and L2 caches. In view of the foregoing, persons of ordinary skill in the art will appreciate that the architecture described in FIG. 1 in no way limits the scope of the various embodiments of the present disclosure.

Multiplexing Control Signals for a Memory Device

Various embodiments include improved techniques for mitigating the effects of duty cycle distortion degradation due to asymmetric aging on high-bandwidth memory interfaces. A dynamic multiplexing circuit switches between an inverted data path and a non-inverted data path with a first multiplexor placed before the delay element included in the data path and a second multiplexor placed after the delay element. The dynamic multiplexing circuit switches the select inputs for these multiplexors, such that the overall polarity of the data path is unchanged, but the multiplexors change the polarity of the intermediate portion of the data path that passes through the delay element. In addition, the multiplexors are switched to change the polarity of the intermediate portion of the data path after a refresh command sent to the memory device.

The dynamic multiplexing circuit changes the polarity by generating a swap pulse with a controllable delay value between the refresh command and the swap pulse. The swap pulse further has a controllable pulse width value. The controllable delay value and pulse width value are software programmable via registers within the dynamic multiplexing circuit. The dynamic multiplexing circuit uses the values stored within the registers to control the timing and the frequency of the swap pulses relative to the refresh commands. The controllable delay value and pulse width value allow the dynamic multiplexing circuit to change the polarity at a time when there are no existing memory transactions in the processing pipeline. As a result, any transient signals or noise generated by the multiplexors when switching polarity would not cause any data integrity issues in the memory devices or in the memory controller. Further, the dynamic multiplexing circuit uses the swap pulses to disable the read data strobe signals and write data strobe signals of the memory device while the multiplexors are switching. Disabling the read data strobe signals and write data strobe signals during switching prevents spurious read operations and/or write operations triggered by any transient signals or noise generated by the multiplexors when switching polarity.

Figure 2A:
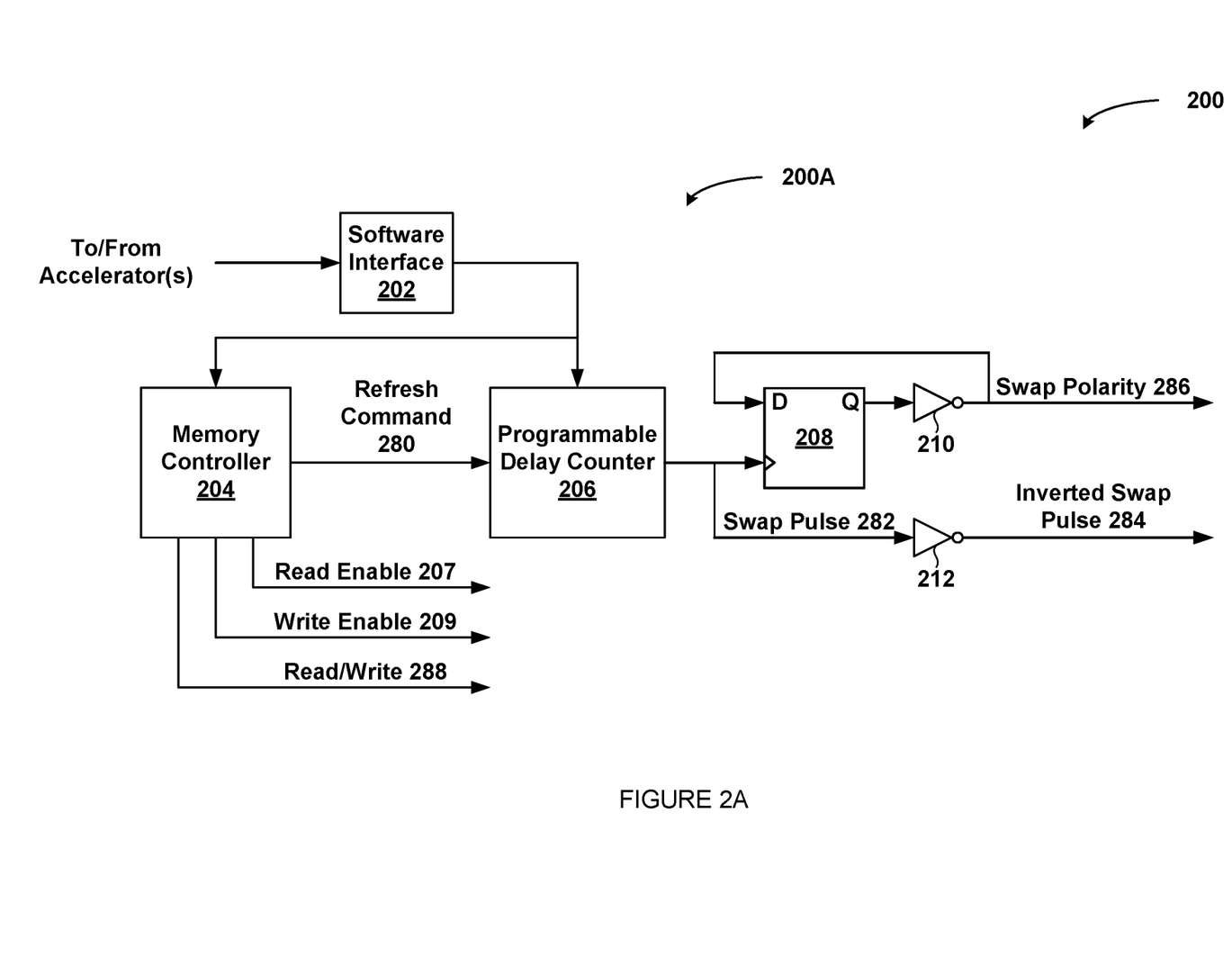
FIGS. 2A-2C set forth a block diagram of a dynamic multiplexing circuit for a memory device included in system memory and/or parallel processing memory of the computer system of FIG. 1, according to various embodiments.
Figure 2B:
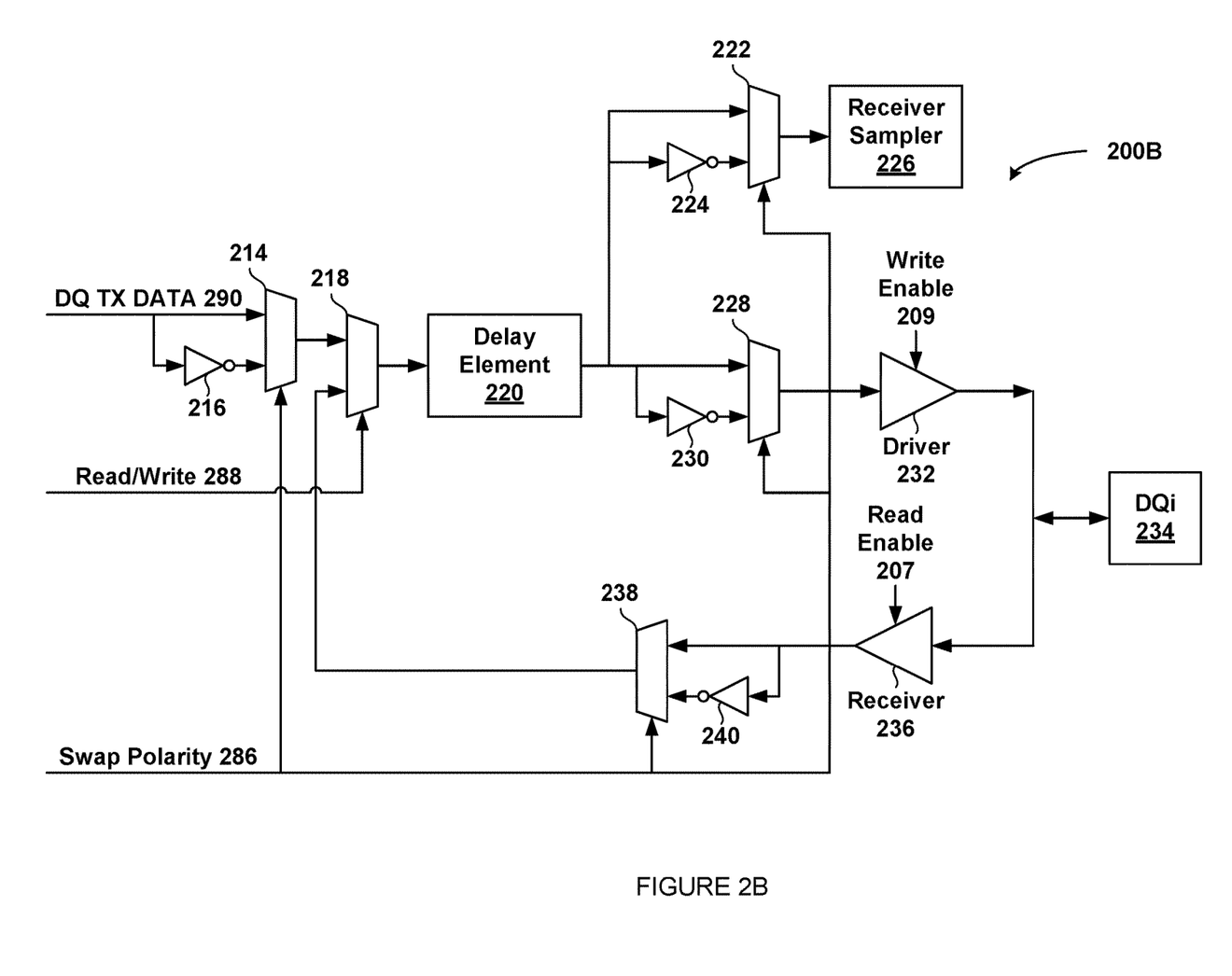
Figure 2C:
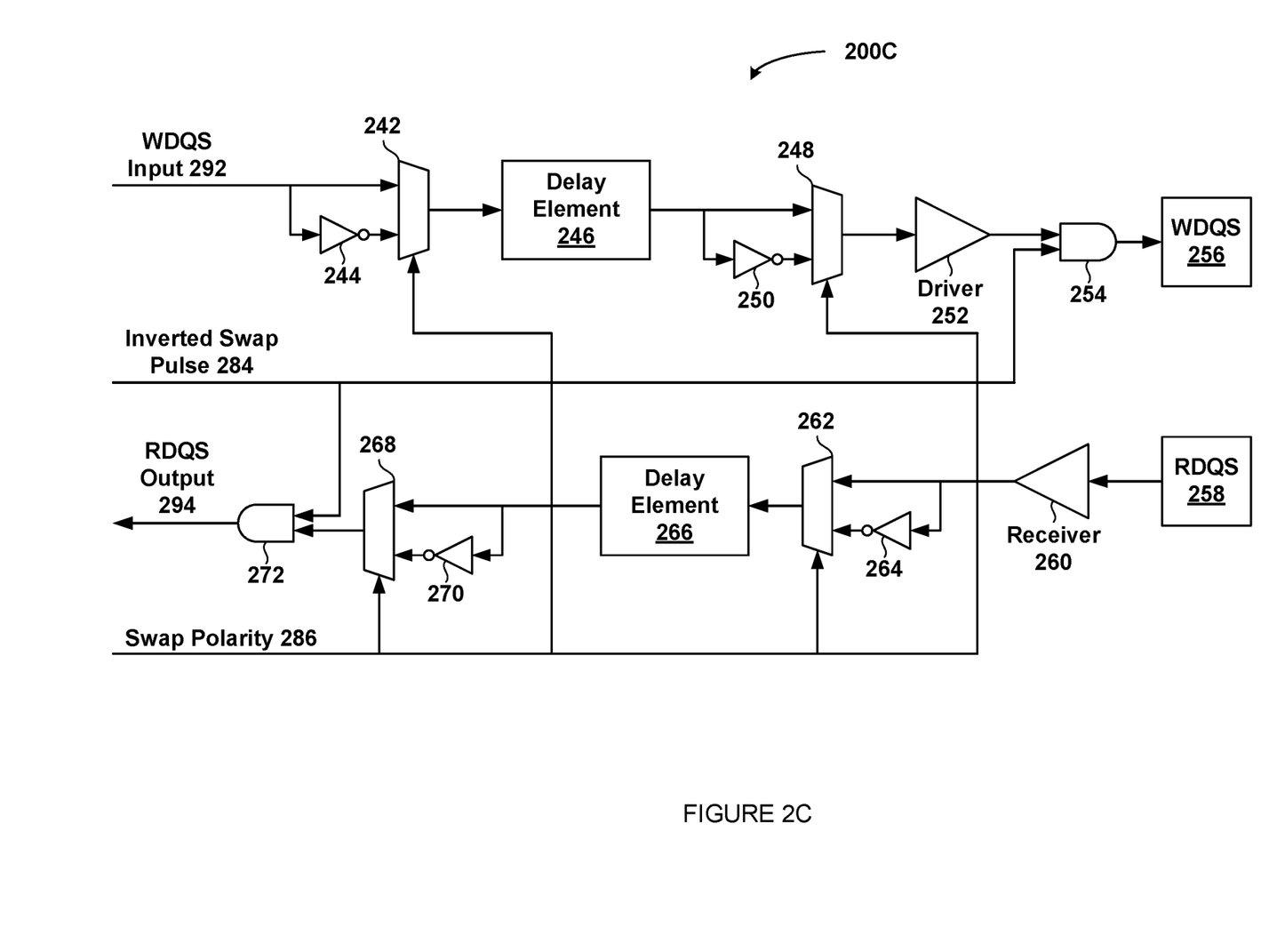

FIGS. 2A-2C set forth a block diagram of a dynamic multiplexing circuit 200 for a memory device included in system memory 104 and/or parallel processing memory 134 of the computer system 100 of FIG. 1, according to various embodiments. As shown, dynamic multiplexing circuit 200 includes, without limitation, a pulse generation subcircuit 200A, a data delay subcircuit 200B, and a strobe delay subcircuit 200C.

Pulse generation subcircuit 200A includes a software interface 202 that is accessible to any one or more of the accelerators disclosed herein. Via software interface 202, an accelerator stores various values into registers included in software interface 202. The values stored in the registers can be read by memory controller 204 and programmable delay counter 206. The values stored in the registers control various aspects of pulse generation subcircuit 200A, such as the delay between a refresh command 280 and a corresponding swap pulse 282 signal, the pulse width of a swap pulse 282 signal, and/or the like.

Memory controller 204 can be any memory controller included in computer system 100, such as system memory controller 130, APS memory controller 132, and/or the like. Memory controller 204 transmits signals to the memory devices included in corresponding memory systems to initiate the memory devices, transmit commands to the memory devices, write data to the memory devices, read data from the memory devices, and/or the like. For example, memory controller 204 generates read enable 207 signals, write enable 209 signals, and read/write 288 signals that identify whether a read operation or a write operation is in progress. Further, memory controller 204 transmits multiple refresh commands 280 to the memory devices over a period of time. In response to receiving a refresh command 280, the memory device reads data from a portion of the memory cells in the memory device and stores the same data back into the portion of the memory cells. Refresh commands 280 enable DRAM memory devices to preserve information stored in the memory cells. Because memory controller 204 generates multiple refresh commands 280 over a period of time, pulse generation subcircuit 200A can detect these refresh commands 280 and employ refresh commands 280 as a trigger to swap polarity of data delay subcircuit 200B and strobe delay subcircuit 200C. Additionally or alternatively, pulse generation subcircuit 200A can employ any suitable signal as a trigger to swap polarity of data delay subcircuit 200B and strobe delay subcircuit 200C. In some examples, a suitable signal is any signal that is generated as multiple events or pulses over a period of time.

Programmable delay counter 206 detects the refresh commands 280 generated by memory controller 204. When programmable delay counter 206 detects a refresh command 280, programmable delay counter 206 generates a corresponding swap pulse 282 signal. Programmable delay counter 206 delays the leading edge of the swap pulse 282 signal from the leading edge of the refresh command 280 with a controllable delay value received from software interface 202. Programmable delay counter 206 generates the swap pulse 282 signal with a controllable pulse width value received from software interface 202. The controllable delay value and controllable pulse width value are set to ensure that transient signals and noise generated by multiplexors during polarity swaps do not change the data to and from the memory device during memory read operations and write operations. The controllable delay value and controllable pulse width value are set to ensure that transient signals and noise generated by multiplexors during polarity swaps do not generate spurious read data strobe signals and/or write data strobe signals. Programmable delay counter 206 transmits the swap pulse 282 signals to D flip-flop 208 and to inverter 212.

D flip-flop 208 receives swap pulse 282 signals from programmable delay counter 206 as a clock signal. At the leading edge of a swap pulse 282 signal, D flip-flop 208 samples the logic state of the D input and presents the sampled logic state at the Q output. Inverter 210 inverts the Q output of D flip-flop 208 and transmits the inverted Q output to the D input of D flip-flop 208. As a result, the D input of D flip-flop 208 has the opposite logic state of the Q output of D flip-flop 208. Consequently, each leading edge of the swap pulse 282 signals causes D flip-flop 208 to swap logic states. If the current Q output of D flip-flop 208 is a logic 0 state, then the D input is a logic 1 state, and a leading edge of a swap pulse 282 signal causes the Q output of D flip-flop 208 to swap to a logic 1 state. Likewise, if the current Q output of D flip-flop 208 is a logic 1 state, then the D input is a logic 0 state, and a leading edge of a swap pulse 282 signal causes the Q output of D flip-flop 208 to swap to a logic 0 state. Inverter 210 transmits the inverted Q output of D flip-flop 208 as a swap polarity 286 signal.

Inverter 212 receives swap pulse 282 signals from programmable delay counter 206 and inverts the swap pulse 282 signals to generate inverted swap pulse 284 signals. The inverted swap pulse 284 is employed by strobe delay subcircuit 200C to disable spurious read data strobe signals and write data strobe signals for the duration of the corresponding swap pulse 282 when the multiplexors are switching.

Data delay subcircuit 200B delays read data and write data for a corresponding data I/O (DQi) 234 pin of the memory device. Data delay subcircuit 200B includes a delay element 220. Delay element 220 can include a delay line, a phase interpolator, and/or the like.

During write operations, memory controller 204 sets the logic state of the read/write 288 signal to indicate that a write operation is in progress. The read/write 288 signal selects the upper input of multiplexor 218, which is the output of multiplexor 214. Multiplexor 214 selects the transmit data (DQ TX data) 290 signal or an inverted version of the transmit data 290 signal (via inverter 216) based on the logic state of the swap polarity 286 signal. Multiplexor 218 transmits the output of multiplexor 214 to delay element 220. Delay element 220 delays the output of multiplexor 214 to generate a delayed signal. Delay element 220 transmits the delayed signal to multiplexor 228. Multiplexor 228 selects the delayed signal or an inverted version of the delayed signal (via inverter 230) based on the logic state of the swap polarity 286 signal. Multiplexor 228 transmits the output of delay element 220 to driver 232. If the write enable 209 signal is active, then driver 232 transmits the output of delay element 220 to data I/O 234 pin.

In one logic state, the swap polarity 286 signal selects the upper inputs of multiplexor 214 and multiplexor 228. Delay element 220 receives the non-inverted version of the transmit data 290 signal, and the non-inverted version of the output of delay element 220 is transmitted to driver 232. In the other logic state, the swap polarity 286 signal selects the lower inputs of multiplexor 214 and multiplexor 228. Delay element 220 receives the inverted version of the transmit data 290 signal, and the inverted version of the output of delay element 220 is transmitted to driver 232. As a result, the polarity of the signal passing through delay element 220 changes as the swap polarity 286 signal changes. However, the polarity of the signal received by driver 232 is the same as the polarity of the non-inverted transmit data 290 signal, regardless of the logic state of the swap polarity 286 signal.

During read operations, memory controller 204 sets the logic state of the read/write 288 signal to indicate that a read operation is in progress. The read/write 288 signal selects the lower input of multiplexor 218, which is the output of multiplexor 238. Multiplexor 238 selects the data from receiver 236 or an inverted version of the data from receiver 236 (via inverter 240) based on the logic state of the swap polarity 286 signal. Receiver 236 receives data from data I/O 234 pin. If the read enable 207 signal is active, then receiver 236 transmits the receive data to multiplexor 238. Multiplexor 218 transmits the output of multiplexor 238 to delay element 220. Delay element 220 delays the output of multiplexor 238 to generate a delayed signal. Delay element 220 transmits the delayed signal to multiplexor 222. Multiplexor 222 selects the delayed signal or an inverted version of the delayed signal (via inverter 224) based on the logic state of the swap polarity 286 signal. Multiplexor 222 transmits the output of delay element 220 to receiver sampler 226. Receiver sampler 226 samples the receive data and stores the receive data in the memory device.

In one logic state, the swap polarity 286 signal selects the upper inputs of multiplexor 238 and multiplexor 222. Delay element 220 receives the non-inverted version of the receive data signal, and the non-inverted version of the output of delay element 220 is transmitted to receiver sampler 226. In the other logic state, the swap polarity 286 signal selects the lower inputs of multiplexor 238 and multiplexor 222. Delay element 220 receives the inverted version of the receive data signal, and the inverted version of the output of delay element 220 is transmitted to receiver sampler 226. As a result, the polarity of the signal passing through delay element 220 changes as the swap polarity 286 signal changes. However, the polarity of the signal received by receiver sampler 226 is the same as the polarity of the non-inverted receive data signal, regardless of the logic state of the swap polarity 286 signal.

Strobe delay subcircuit 200C delays write data strobe input (WDQS input) 292 signals transmitted to a write data strobe (WDQS) 256 pin of the memory device. Further, strobe delay subcircuit 200C delays read data strobe signals received from read data strobe (RDQS) 258 pin of the memory device. Strobe delay subcircuit 200C includes a first delay element 246 for delaying write data strobe input 292 signals and a second delay element 266 for delaying read data strobe signals received from read data strobe 258 pin. Each of delay element 246 and delay element 266 can include a delay line, a phase interpolator, and/or the like.

During write operations, multiplexor 242 selects the write data strobe input 292 signal or an inverted version of the write data strobe input 292 signal (via inverter 244) based on the logic state of the swap polarity 286 signal. Multiplexor 242 transmits the selected input to delay element 246. Delay element 246 delays the output of multiplexor 242 to generate a delayed signal. Delay element 246 transmits the delayed signal to multiplexor 248. Multiplexor 248 selects the delayed signal or an inverted version of the delayed signal (via inverter 250) based on the logic state of the swap polarity 286 signal. Multiplexor 248 transmits the output of delay element 246 to driver 252.

Driver 252 transmits the output of delay element 246 to a first input of a two-input AND gate 254. The second input of two-input AND gate 254 is the inverted swap pulse 284 signal generated by pulse generation subcircuit 200A. When a polarity swap is not occurring, the swap pulse 282 signal is at a low logic level and, therefore, the inverted swap pulse 284 signal is at a high logic level. The high logic level of the inverted swap pulse 284 signal enables two-input AND gate 254 to transmit the output of driver 252 to write data strobe 256 pin of the memory device. When a polarity swap is occurring, the swap pulse 282 signal is at a high logic level and, therefore, the inverted swap pulse 284 signal is at a low logic level. The low logic level of the inverted swap pulse 284 signal disables two-input AND gate 254 from transmitting the output of driver 252 to write data strobe 256 pin of the memory device. As a result, write data strobe signals are disabled while the multiplexors are switching. Disabling the write data strobe signals during switching prevents spurious write operations triggered by any transient signals or noise generated by the multiplexors when switching polarity.

In one logic state, the swap polarity 286 signal selects the upper inputs of multiplexor 242 and multiplexor 248. Delay element 246 receives the non-inverted version of the write data strobe input 292 signal, and the non-inverted version of the output of delay element 246 is transmitted to driver 252. In the other logic state, the swap polarity 286 signal selects the lower inputs of multiplexor 242 and multiplexor 248. Delay element 246 receives the inverted version of the write data strobe input 292 signal, and the inverted version of the output of delay element 246 is transmitted to driver 252. As a result, the polarity of the signal passing through delay element 246 changes as the swap polarity 286 signal changes. However, the polarity of the signal received by driver 252 is the same as the polarity of the non-inverted write data strobe input 292 signal, regardless of the logic state of the swap polarity 286 signal.

During read operations, receiver 260 receives read data strobe signals from read data strobe 258 pin of the memory device and transmits read data strobe signals to multiplexor 262. Multiplexor 262 selects the read data strobe signal or an inverted version of the read data strobe signal (via inverter 264) based on the logic state of the swap polarity 286 signal. Multiplexor 262 transmits the selected input to delay element 266. Delay element 266 delays the output of multiplexor 262 to generate a delayed signal. Delay element 266 transmits the delayed signal to multiplexor 268. Multiplexor 268 selects the delayed signal or an inverted version of the delayed signal (via inverter 270) based on the logic state of the swap polarity 286 signal.

Multiplexor 268 transmits the output of delay element 266 to a first input of a two-input AND gate 272. The second input of two-input AND gate 272 is the inverted swap pulse 284 signal generated by pulse generation subcircuit 200A. When a polarity swap is not occurring, the swap pulse 282 signal is at a low logic level and, therefore, the inverted swap pulse 284 signal is at a high logic level. The high logic level of the inverted swap pulse 284 signal enables two-input AND gate 272 to transmit the output of multiplexor 268 to the read data strobe 294 output. When a polarity swap is occurring, the swap pulse 282 signal is at a high logic level and, therefore, the inverted swap pulse 284 signal is at a low logic level. The low logic level of the inverted swap pulse 284 signal disables two-input AND gate 272 from transmitting the output of multiplexor 268 to the read data strobe 294 output. As a result, read data strobe signals are disabled while the multiplexors are switching. Disabling the read data strobe signals during switching prevents spurious read operations triggered by any transient signals or noise generated by the multiplexors when switching polarity.

In one logic state, the swap polarity 286 signal selects the upper inputs of multiplexor 262 and multiplexor 268. Delay element 266 receives the non-inverted version of the signal received from the read data strobe 258 pin of the memory device, and the non-inverted version of the output of delay element 266 is transmitted as the read data strobe output 294 signal. In the other logic state, the swap polarity 286 signal selects the lower inputs of multiplexor 262 and multiplexor 268. Delay element 266 receives the inverted version of the signal received from the read data strobe 258 pin of the memory device, and the inverted version of the output of delay element 266 is transmitted as the read data strobe output 294 signal. As a result, the polarity of the signal passing through delay element 266 changes as the swap polarity 286 signal changes. However, the polarity of the read data strobe output 294 signal is the same as the polarity of the non-inverted signal received from the read data strobe 258, regardless of the logic state of the swap polarity 286 signal.

Figure 3:
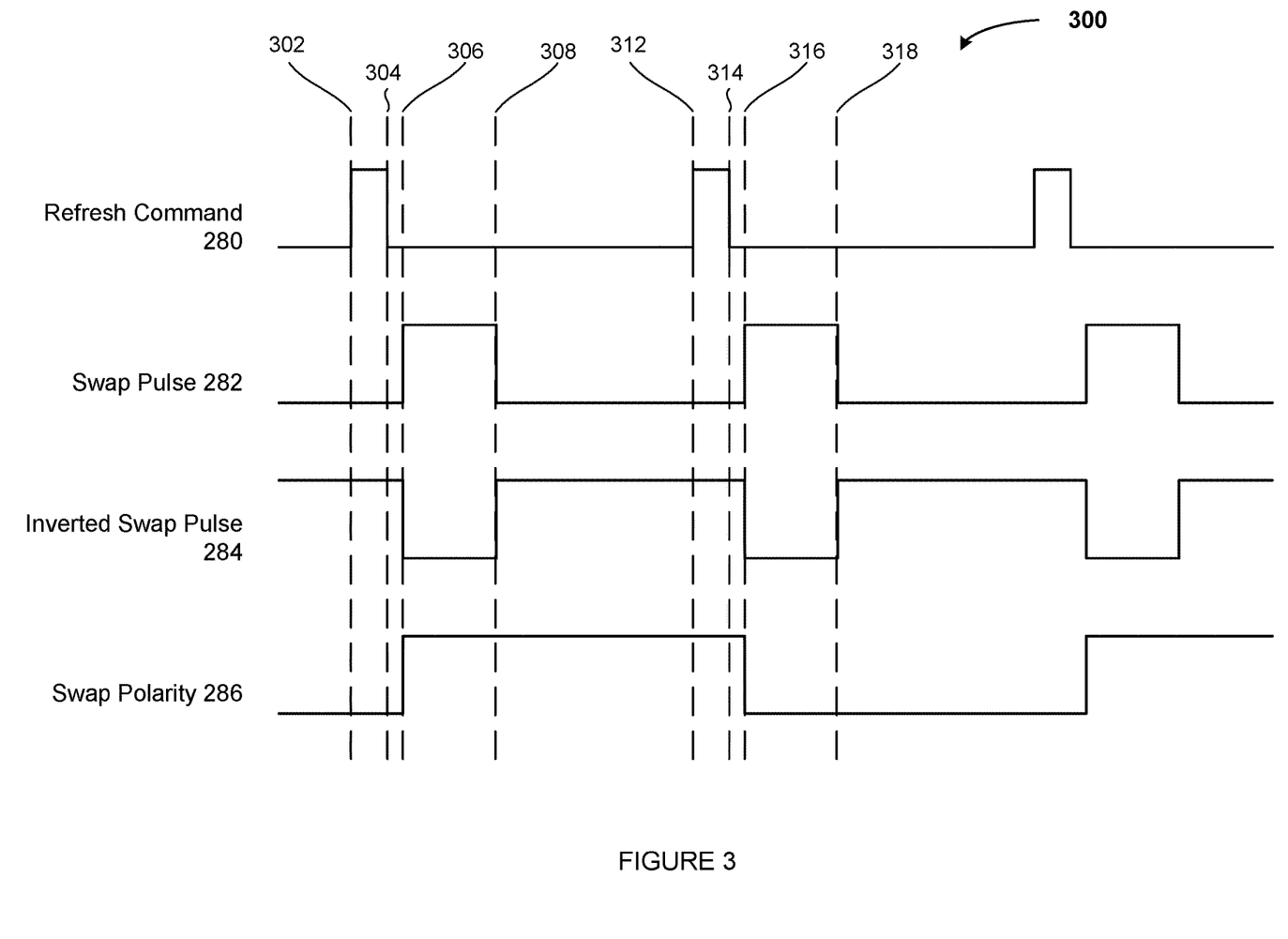
FIG. 3 is a timing diagram for the dynamic multiplexing circuit of FIGS. 2A-2C, according to various embodiments.

FIG. 3 is a timing diagram 300 for the dynamic multiplexing circuit 200 of FIGS. 2A-2C, according to various embodiments. As shown, memory controller 204 generates multiple refresh commands 280 over a period of time. Memory controller 204 generates a first refresh command 280 with a leading edge at time 302 and a trailing edge at time 304. In response to detecting the first refresh command 280, programmable delay counter 206 generates a corresponding swap pulse 282 signal with a leading edge at time 306 and a trailing edge at time 308. Programmable delay counter 206 delays the leading edge of the swap pulse 282 signal at time 306 from the leading edge of the refresh command 280 at time 302 with a controllable delay value received from software interface 202. Programmable delay counter 206 generates the swap pulse 282 signal with a controllable pulse width value between time 306 and time 308, where the pulse width value is received from software interface 202. The values for the controllable delay value and controllable pulse width value are set to ensure that transient signals and noise generated by multiplexors during polarity swaps do not change the data to and from the memory device during memory read operations and write operations. An inverted swap pulse 284 signal is generated with the same timing as the swap pulse 282 signal, with a leading edge at time 306 and a trailing edge at time 308. The controllable delay value and controllable pulse width value for the inverted swap pulse 284 signal are set to ensure that transient signals and noise generated by multiplexors during polarity swaps do not generate spurious read data strobe signals and/or write data strobe signals.

At the time of the first refresh command 280 with a leading edge at time 302 and a trailing edge at time 304, the swap polarity 286 signal is at a low logic level. The leading edge of the swap pulse 282 signal at time 306 changes the polarity of the swap polarity 286 signal from a low logic level to a high logic level. Subsequently, memory controller 204 generates a second refresh command 280 with a leading edge at time 312 and a trailing edge at time 314. In response to detecting the second refresh command 280, programmable delay counter 206 generates a corresponding swap pulse 282 signal with a leading edge at time 316 and a trailing edge at time 318. An inverted swap pulse 284 signal is generated with the same timing as the swap pulse 282 signal, with a leading edge at time 316 and a trailing edge at time 318. The controllable delay value and controllable pulse width value for the swap pulse 282 signal and the inverted swap pulse 284 signal are set as described above. At the time of the second refresh command 280 with a leading edge at time 312 and a trailing edge at time 314, the swap polarity 286 signal is at a high logic level. The leading edge of the swap pulse 282 signal at time 316 changes the polarity of the swap polarity 286 signal from a high logic level to a low logic level.

Figure 4:
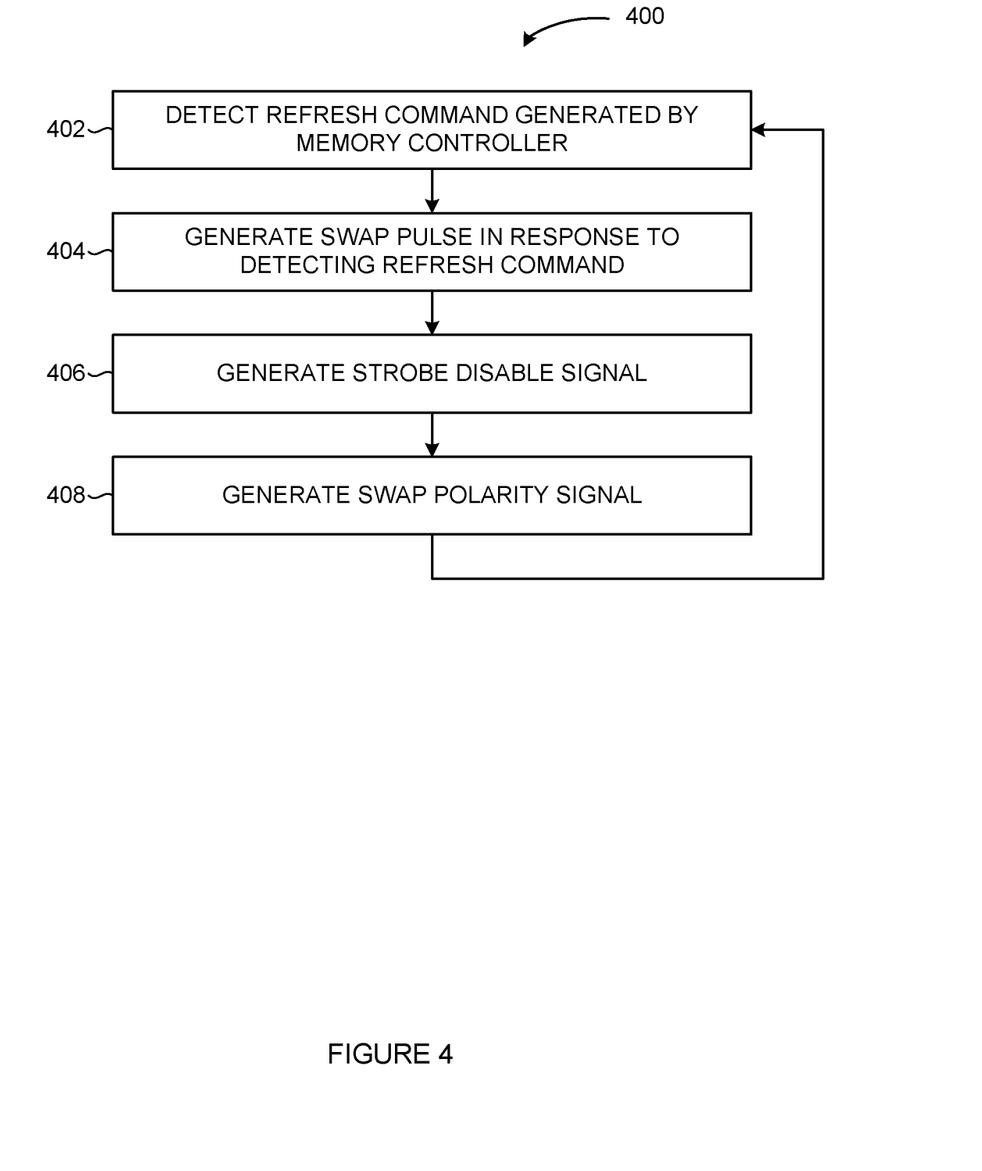
FIG. 4 is a flow diagram of method steps for generating control signals for a memory device included in system memory and/or parallel processing memory of the computer system of FIG. 1, according to various embodiments.

FIG. 4 is a flow diagram of method steps for generating control signals for a memory device included in system memory 104 and/or parallel processing memory 134 of the computer system 100 of FIG. 1, according to various embodiments. Although the method steps are described in conjunction with the systems of FIGS. 1-3, persons of ordinary skill in the art will understand that any system configured to perform the method steps, in any order, is within the scope of the present disclosure.

As shown, a method 400 begins at step 402, where a dynamic multiplexing circuit 200 detects a refresh command 280 generated by a memory controller 204. Memory controller 204 can be any memory controller included in computer system 100, such as system memory controller 130, APS memory controller 132, and/or the like. Memory controller 204 transmits multiple refresh commands 280 to the memory devices over a period of time. In response to receiving a refresh command 280, the memory device reads data from a portion of the memory cells in the memory device and stores the same data back into the portion of the memory cells. Refresh commands 280 enable DRAM memory devices to preserve information stored in the memory cells. Because memory controller 204 generates multiple refresh commands 280 over a period of time, dynamic multiplexing circuit 200 can detect these refresh commands 280 and employ refresh commands 280 as a trigger to swap polarity of data I/O signal paths, read data strobe signal paths, and/or write data strobe signal paths. Additionally or alternatively, dynamic multiplexing circuit 200 can employ any suitable signal as a trigger to swap polarity of data I/O signal paths, read data strobe signal paths, and/or write data strobe signal paths. In some examples, a suitable signal is any signal that is generated as multiple events or pulses over a period of time.

At step 404, dynamic multiplexing circuit 200 generates a swap pulse 282 in response to detecting the refresh command 280 generated by memory controller 204. Dynamic multiplexing circuit 200 generates the swap pulse 282 signal with a leading edge and a trailing edge based on values received from registers included in a software interface 202. Dynamic multiplexing circuit 200 delays the leading edge of the swap pulse 282 signal from the leading edge of the refresh command 280 with a controllable delay value received from software interface 202. Programmable delay counter 206 generates the swap pulse 282 signal with a controllable pulse width value received from software interface 202. The values for the controllable delay value and controllable pulse width value are set to ensure that transient signals and noise generated by multiplexors during polarity swaps do not change the data to and from the memory device during memory read operations and write operations.

At step 406, dynamic multiplexing circuit 200 generates a strobe disable signal. In some examples, the strobe disable signal is an inverted swap pulse 284. Dynamic multiplexing circuit 200 generates the inverted swap pulse 284 signal with the same timing as the swap pulse 282 signal. The controllable delay value and controllable pulse width value for the inverted swap pulse 284 signal are set to ensure that transient signals and noise generated by multiplexors during polarity swaps do not generate spurious read data strobe signals and/or write data strobe signals.

At step 408, dynamic multiplexing circuit 200 generates a swap polarity 286 signal to change the polarity of signals transmitted to and received from delay elements of the memory device. More specifically, the swap polarity 286 signal changes the polarity of signals transmitted to and received from delay elements 220 associated with data I/O 234 pins of the memory device. Further, the swap polarity 286 signal changes the polarity of signals transmitted to and received from delay elements 246 associated with write data strobe 256 pins of the memory device. In addition, the swap polarity 286 signal changes the polarity of signals transmitted to and received from delay elements 266 associated with read data strobe 258 pins of the memory device. Although the swap polarity 286 signal changes the polarity of signals transmitted to and received from the delay elements, the polarity of the overall data signal paths, write strobe signal paths, and/or read strobe signal paths remain unchanged. The method 400 then proceeds to step 402 to detect subsequent refresh commands 280.

In sum, various embodiments include improved techniques for mitigating the effects of duty cycle distortion degradation due to asymmetric aging on high-bandwidth memory interfaces. A dynamic multiplexing circuit switches between an inverted data path and a non-inverted data path with a first multiplexor placed before the delay element included in the data path and a second multiplexor placed after the delay element. The dynamic multiplexing circuit switches the select inputs for these multiplexors, such that the overall polarity of the data path is unchanged, but the multiplexors change the polarity of the intermediate portion of the data path that passes through the delay element. In addition, the multiplexors are switched to change the polarity of the intermediate portion of the data path after a refresh command sent to the memory device.

The dynamic multiplexing circuit changes the polarity by generating a swap pulse with a controllable delay value between the refresh command and the swap pulse. The swap pulse further has a controllable pulse width value. The controllable delay value and pulse width value are software programmable via registers within the dynamic multiplexing circuit. The dynamic multiplexing circuit uses the values stored within the registers to control the timing and the frequency of the swap pulses relative to the refresh commands. The controllable delay value and pulse width value allow the dynamic multiplexing circuit to change the polarity at a time when there are no existing memory transactions in the processing pipeline. As a result, any transient signals or noise generated by the multiplexors when switching polarity would not cause any data integrity issues in the memory devices or in the memory controller. Further, the dynamic multiplexing circuit uses the swap pulses to disable the read data strobe signals and write data strobe signals of the memory device while the multiplexors are switching. Disabling the read data strobe signals and write data strobe signals during switching prevents spurious read operations and/or write operations triggered by any transient signals or noise generated by the multiplexors when switching polarity.

At least one technical advantage of the disclosed techniques relative to the prior art is that, with the disclosed techniques, transistors included in delay lines of a memory device are not exposed to long sequences of zero values or one values over prolonged periods of time. As a result, the effects of asymmetric aging of NMOS transistors and PMOS transistors included in delay lines of a memory device are reduced relative to prior approaches. By reducing the effects of asymmetric aging, the disclosed techniques enable all memory devices to reliably operate at a higher frequency relative to prior techniques, leading to increased memory performance. These advantages represent one or more technological improvements over prior art approaches.

Any and all combinations of any of the claim elements recited in any of the claims and/or any elements described in this application, in any fashion, fall within the contemplated scope of the present disclosure and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method, or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods, and computer program products according to various embodiments of the present disclosure. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A method for generating control signals for a memory device, the method comprising:
   detecting a first refresh command directed to the memory device;
   in response to detecting the first refresh command, selecting a first polarity for a delay element of the memory device;
   detecting a second refresh command directed to the memory device; and
   in response to detecting the second refresh command, selecting a second polarity for the delay element of the memory device.

2. The method of claim 1, wherein selecting the first polarity for the delay element comprises changing a logic level of a swap polarity signal from a first logic level to a second logic level.

3. The method of claim 2, further comprising:
   selecting a first input of a multiplexor when the logic level of the swap polarity signal is the first logic level; and
   selecting a second input of the multiplexor when the logic level of the swap polarity signal is the second logic level,
   wherein a first signal present on the first input of the multiplexor is an inverted version of a second signal present on the second input of the multiplexor.

4. The method of claim 1, wherein the delay element is included in a data path associated with a data input/output pin of the memory device.

5. The method of claim 1, wherein the delay element is included in a data path associated with at least one of a read data strobe pin or a write data strobe pin of the memory device.

6. The method of claim 1, further comprising generating a swap pulse signal, wherein a leading edge of the swap pulse signal is delayed from a leading edge of the first refresh command by a controllable delay value.

7. The method of claim 6, wherein the swap pulse signal has a pulse width based on a controllable pulse width value.

8. The method of claim 7, wherein at least one of the controllable delay value or the controllable pulse width value is received from a software interface.

9. The method of claim 1, further comprising disabling at least one of a read data strobe of the memory device or a write data strobe of the memory device while selecting the first polarity for the delay element.

10. The method of claim 1, wherein the delay element includes at least one of a delay line or a phase interpolator.

11. A system, comprising:
   a memory controller; and
   a memory device comprising:
      a delay element, and
      a multiplexing circuit that:
         detects a first refresh command received from the memory controller and directed to the memory device;
         in response to detecting the first refresh command, selects a first polarity for a delay element of the memory device;
         detects a second refresh command directed to the memory device; and
         in response to detecting the second refresh command, selects a second polarity for the delay element of the memory device.

12. The system of claim 11, wherein to select the first polarity for the delay element, the multiplexing circuit further changes a logic level of a swap polarity signal from a first logic level to a second logic level.

13. The system of claim 12, wherein the multiplexing circuit further:
   selects a first input of a multiplexor when the logic level of the swap polarity signal is the first logic level; and
   selects a second input of the multiplexor when the logic level of the swap polarity signal is the second logic level,
   wherein a first signal present on the first input of the multiplexor is an inverted version of a second signal present on the second input of the multiplexor.

14. The system of claim 11, wherein the delay element is included in a data path associated with a data input/output pin of the memory device.

15. The system of claim 11, wherein the delay element is included in a data path associated with at least one of a read data strobe pin or a write data strobe pin of the memory device.

16. The system of claim 11, wherein the multiplexing circuit further generates a swap pulse signal, wherein a leading edge of the swap pulse signal is delayed from a leading edge of the first refresh command by a controllable delay value.

17. The system of claim 16, wherein the swap pulse signal has a pulse width based on a controllable pulse width value.

18. The system of claim 17, wherein at least one of the controllable delay value or the controllable pulse width value is received from a software interface.

19. The system of claim 11, wherein the multiplexing circuit further disables at least one of a read data strobe of the memory device or a write data strobe of the memory device while selecting the first polarity for the delay element.

20. The system of claim 11, wherein the delay element includes at least one of a delay line or a phase interpolator.

* * * * *